United States Patent
Yao et al.

(10) Patent No.: US 10,090,782 B2
(45) Date of Patent: Oct. 2, 2018

(54) DRUM-TYPE WIDE-FREQUENCY PIEZOELECTRIC POWER GENERATION APPARATUS

(71) Applicant: Beijing University of Technology, Beijing (CN)

(72) Inventors: Minghui Yao, Beijing (CN); Yinbo Li, Beijing (CN); Wei Zhang, Beijing (CN); Pengfei Liu, Beijing (CN); Dongxing Cao, Beijing (CN)

(73) Assignee: Beijing University of Technology, Beijing (CN)

( * ) Notice: Subject to any disclaimer, the term of this patent is extended or adjusted under 35 U.S.C. 154(b) by 309 days.

(21) Appl. No.: 15/120,586

(22) PCT Filed: Apr. 30, 2015

(86) PCT No.: PCT/CN2015/077889
§ 371 (c)(1),
(2) Date: Aug. 22, 2016

(87) PCT Pub. No.: WO2015/110094
PCT Pub. Date: Jul. 30, 2015

(65) Prior Publication Data
US 2017/0012558 A1    Jan. 12, 2017

(30) Foreign Application Priority Data
Nov. 25, 2014 (CN) .......................... 2014 1 0686218

(51) Int. Cl.
*H01L 41/113* (2006.01)
*H02N 2/18* (2006.01)
*H01L 41/083* (2006.01)

(52) U.S. Cl.
CPC ........... *H02N 2/186* (2013.01); *H01L 41/083* (2013.01); *H01L 41/1136* (2013.01)

(58) Field of Classification Search
CPC .... H02N 2/186; H01L 41/083; H01L 41/1136
(Continued)

(56) References Cited

U.S. PATENT DOCUMENTS

2011/0215590 A1* 9/2011 Arnold ................. H02K 7/1892
290/1 R
2016/0013396 A1* 1/2016 Chung ................ H01L 41/1136
345/156

* cited by examiner

*Primary Examiner* — Thomas Dougherty
(74) *Attorney, Agent, or Firm* — Zhihua Han; Le Tian

(57) ABSTRACT

A drum-type wide-frequency piezoelectric power generation apparatus may include a protective layer pasted on piezoelectric layer through epoxy resin glue or other conductive adhesives. The piezoelectric layer is pasted on the base layer through epoxy resin or other conductive adhesives. One side of piezoelectric vibrators are fixed on the end cap "a" through the clamp and are away from a first permanent magnet. The end cap "a" provided an octagonal boss "a". There are bosses "b", "c", "d" on the surface of boss "a". The four piezoelectric vibrators are fixed on four symmetry planes of bosses "a", "b", "c", "d". The four planes of end cap "a" are fixed on piezoelectric vibrator corresponding to four straight slots respectively, which are used to fix the clamp. The auxiliary magnet is closer to the center of end cap "b" than second permanent magnet. Each of second permanent magnets has a corresponding auxiliary magnet. The first second permanent magnets are mutually exclusive. The auxiliary magnet is mutually exclusive with first permanent magnet.

6 Claims, 11 Drawing Sheets

(58) Field of Classification Search
USPC .......................................................... 310/339
See application file for complete search history.

DRUM-TYPE WIDE-FREQUENCY PIEZOELECTRIC POWER GENERATION APPARATUS

CROSS REFERENCE TO RELATED APPLICATION

This application is a national stage application of International Application No. PCT/CN2015/077889, filed Apr. 30, 2015, titled "Drum-Type Wide-Frequency Piezoelectric Power Generation Apparatus," which claims the priority benefit of Chinese Patent Application No. 201410686218.7, filed on Nov. 25, 2014 which is hereby incorporated by reference in its entirety.

TECHNICAL FIELD

The present disclosure relates to the field of new energy generation and renewable energy, and particularly to a drum-type wide-frequency piezoelectric power generation apparatus, which collects mechanical vibration energy of surrounding environment to effectively generate electricity.

BACKGROUND

With rapid development of microelectronics and wireless network, vibration energy in natural environment can be converted into electric energy, solving problems of battery replacement and saving energy as well as protecting environment. Therefore, people may use environmental vibration to produce energy for electronic equipment.

A cantilever piezoelectric vibrator has characteristics of large relative amplitude and a low frequency with strong application. A Chinese patent (No. CN102790547A) discloses a bistable and double cantilever beam piezoelectric power generator. Two symmetrical bistable piezoelectric cantilever are arranged in the same device so as to effectively improve power generation. A Chinese patent (No. CN102790548A) discloses a bistable composite cantilever beam piezoelectric power generator. Eight-bistable piezoelectric cantilever vibrators are arranged in one device so as to improve the efficiency of power generation. A PCT patent application (No. WO2010151738A3) discloses a bistable piezoelectric cantilever power generation device. The resonance frequency band of cantilever beam has been widened effectively; but extent of bandwidth is not very large.

SUMMARY

Implementations herein broaden an effective frequency domain of piezoelectric generators to increase bandwidth, reduce resonance frequency, and increase voltage. The present disclosure provides a drum-type wide-frequency piezoelectric power generation apparatus. By introducing four piezoelectric vibrators in a small space, power generation efficiency can be increased effectively, and volume of power generation device can be reduced such as to satisfy needs of development of Microelectromechanical systems (MEMS).

In order to solve the technical problems above, technical schemes of the present disclosure are provides as follow. A drum-type wide-frequency piezoelectric power generation apparatus may include: a piezoelectric vibrator, an end cap "a", a clamp "a", a clamp "b", a clamp "c", a clamp "d", a sleeve and end cap "b", piezoelectric vibrator includes a base layer, a piezoelectric layer, a protective layer, and a first permanent magnet in the end, wherein the protective layer is pasted on piezoelectric layer through epoxy resin glue or other conductive adhesives, the piezoelectric layer is pasted on base layer by epoxy resin glue or other conductive adhesives, one end of piezoelectric vibrator far away from the first permanent magnet is fixed on the end cap "a", end cap "a" provided an octagonal boss, there are bosses "b", "c", "d" on the surface of boss "a", bosses "a", "b", "c", "d" are integrated structure ; boss "b" is higher than boss "a", boss "c" is higher than boss "b", boss "d" is higher than boss "c", the four piezoelectric vibrators is fixed on four symmetry planes of bosses "a", "b", "c", "d", four planes of end cap "a" fixed on piezoelectric vibrator corresponds to four straight slots respectively, slot "a" corresponds to boss "a", slot "b" corresponds to boss "b", slot "c" corresponds to boss "c", slot "d" corresponds to boss "d", one end of all the clamps with screw thread is extended from one side of straight slots and is fixed with a nut, on the other side of the clamps will press piezoelectric vibrator tightly, a compression degree of the piezoelectric vibrator with different thickness can be adjusted by adjusting the position of clamp, the clamp "a" corresponds to straight slots "a", clamp "b" corresponds to straight slots "b", clamp "c" corresponds to straight slots "c", clamp "d" corresponds to straight slots "d", the splint length of clamp "b" is longer than clamp "a", the disparity value is about 5%-10% of the length of press piezoelectric vibrator, the splint length of clamp "c" is longer than clamp "b", the disparity value is about 7%-15% of the length of the press piezoelectric vibrator, the splint length of clamp "d" is longer than clamp "c", the disparity value is about 10%-20% of the length of the press piezoelectric vibrator, a sleeve is connected to end cap "a" and they can be tightened, the other end of sleeve is connected with end cap "b", end cap "b" is distributed with four central symmetrical second permanent magnets and four center symmetrical auxiliary magnets, the second permanent magnet is placed corresponding to first permanent magnet and they mutually exclusive, the second permanent magnets are located on a horizontal motion center line of the first permanent magnet, the auxiliary magnet is closer to the center of end cap "b" than the second permanent magnet, and each of second permanent magnets has a corresponding auxiliary magnet, and the auxiliary magnet is mutually exclusive with first permanent magnet.

Compared with the current technology, the present disclosure has beneficial effects as follow.

The present disclosure includes four piezoelectric vibrators. Compared with the single piezoelectric vibrator, the generated power has been increased.

The auxiliary magnets are added to expand effective working frequency domain and increase power generation.

Because of the different splint length of clamps "a", "b", "c", "d", and length differences re provided. The lengths increase with gradients. During the whole process of vibration, four piezoelectric vibrators have different range of efficient power generation frequency, with a sum of 4 effective frequency domains, the effective frequency domain of whole structure is broadened and generated power increases.

As illustrated in the figures above, 1 represents Piezoelectric vibrators, 2 represents a protective layer, 3 represents a piezoelectric layer, 4 represents a base layer, 5 represents a first permanent magnet, 6 represents a straight slot "b", 7 represents a boss "b", 8 represents an end cap "a", 9 represents a straight slot "a", 10 represents a boss "a", 11 represents a boss "d", 12 represents a straight slot "d", 13 represents a boss "c", 14 represents a straight slot "c", 15 represents a clamp "a", 16 represents a splint, 17 represents a sleeve, 18 represents an end cap "b", 19 represents an auxiliary magnets, 20 represents a second permanent magnets, 21 represents a clamp "b", 22 represents a clamp "c", and 23 represents a clamp "d".

DETAILED DESCRIPTION OF THE PREFERRED EMBODIMENTS

Figure 1:
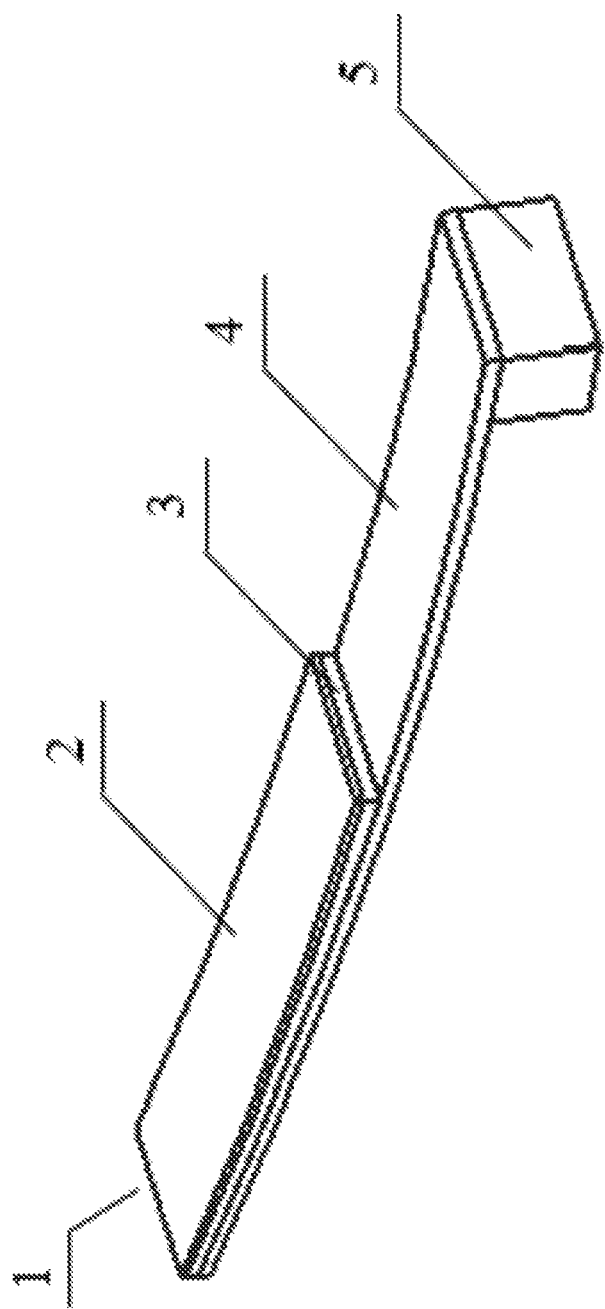
FIG. 1 is a schematic diagram of a structure of piezoelectric vibrators.
Figure 2:
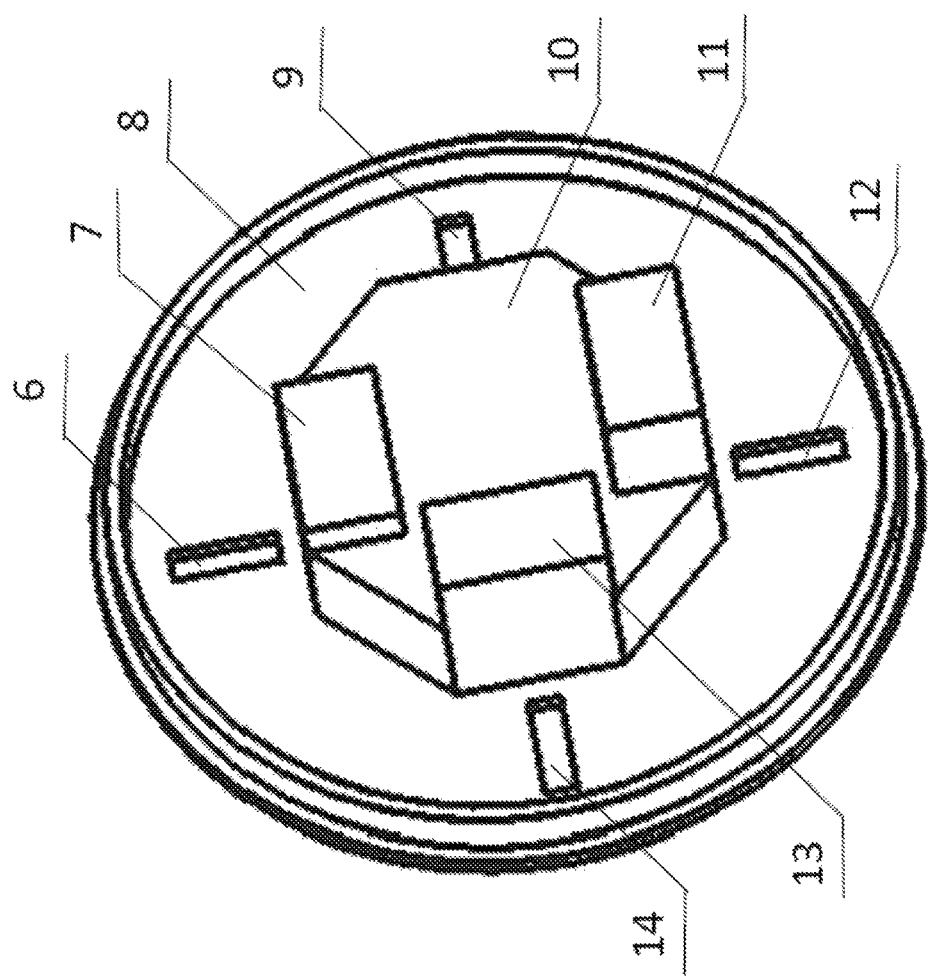
FIG. 2 is a schematic diagram of a structure of end cap "a".
Figure 3:
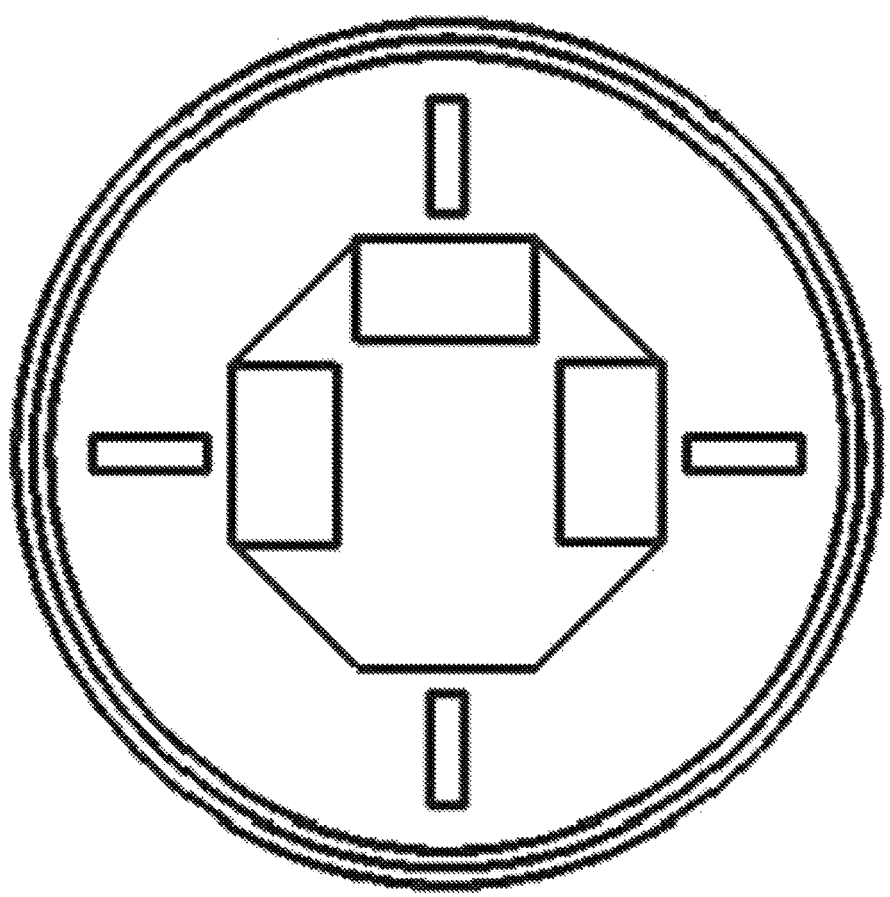
FIG. 3 is a top plane view of a structure of end cap "a".
Figure 4:
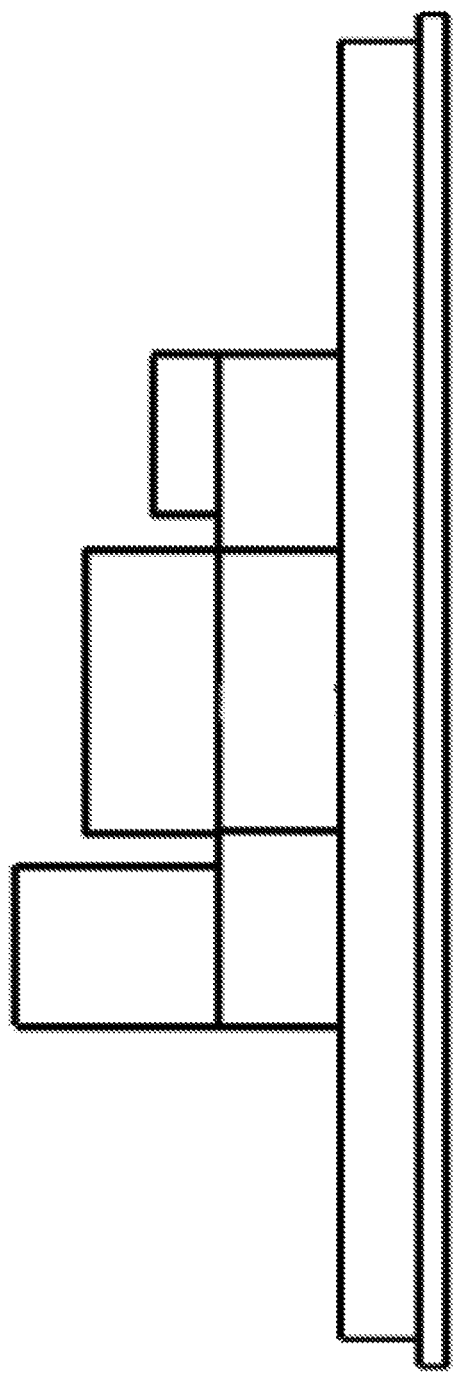
FIG. 4 is a front view of a structure of end cap "a".
Figure 5:
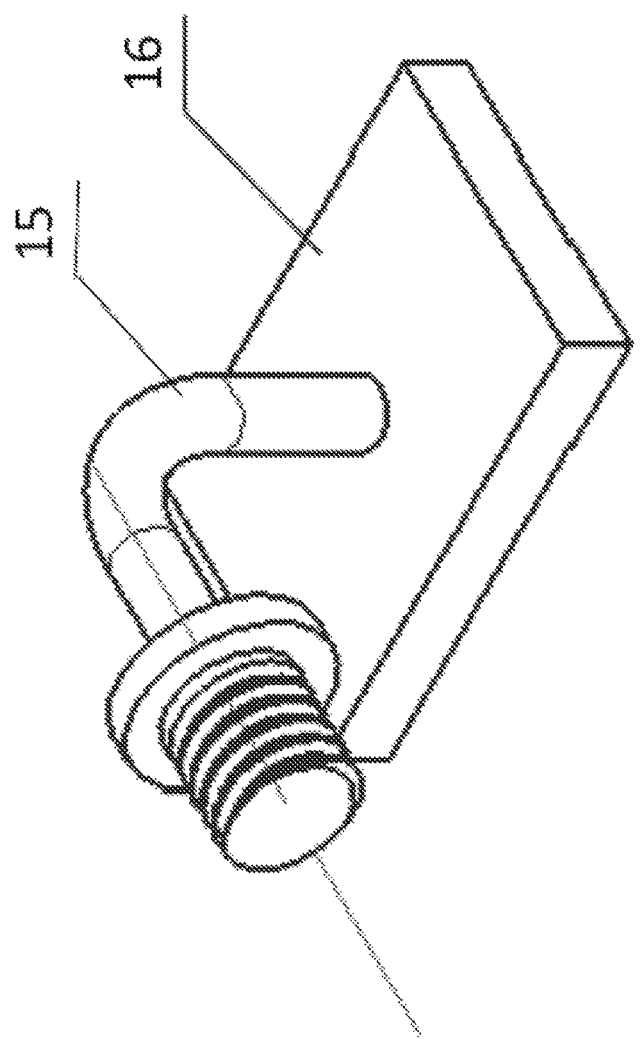
FIG. 5 is a schematic diagram of a structure of clamp "a".
Figure 6:
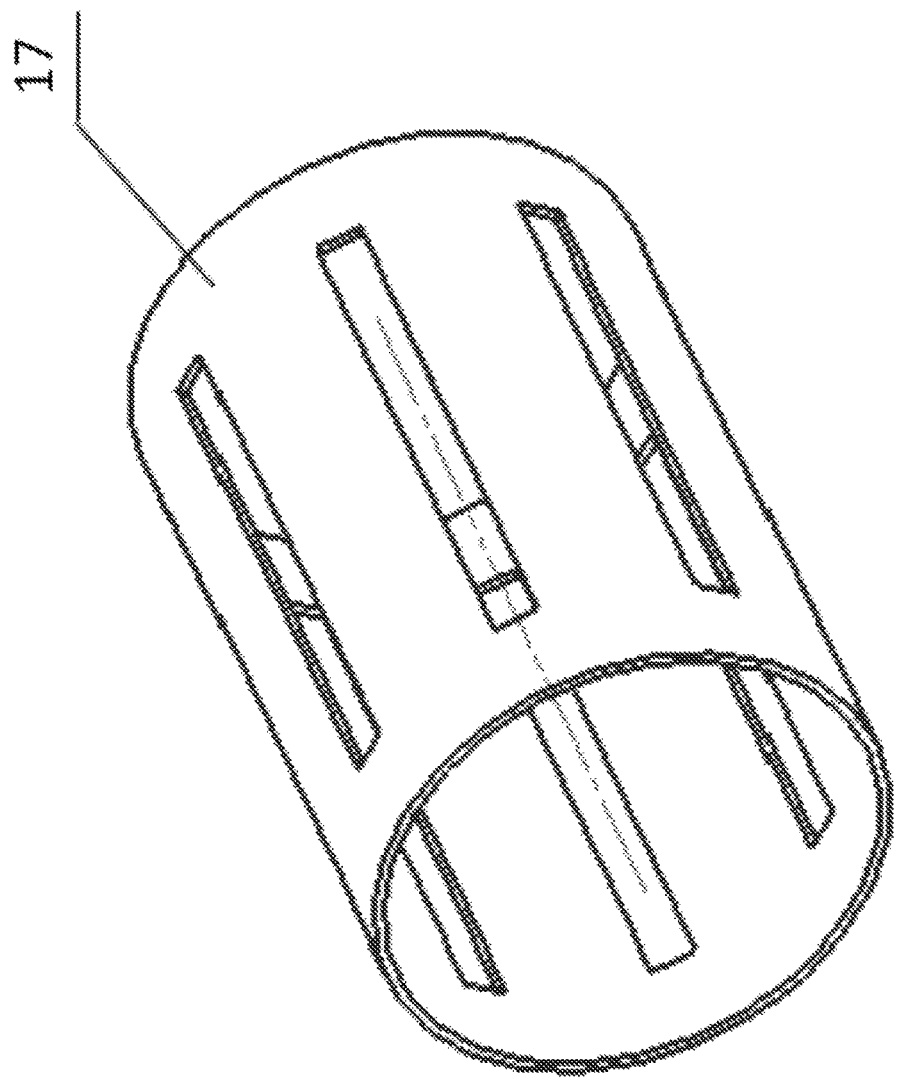
FIG. 6 is a schematic diagram of a structure of sleeve.
Figure 7:
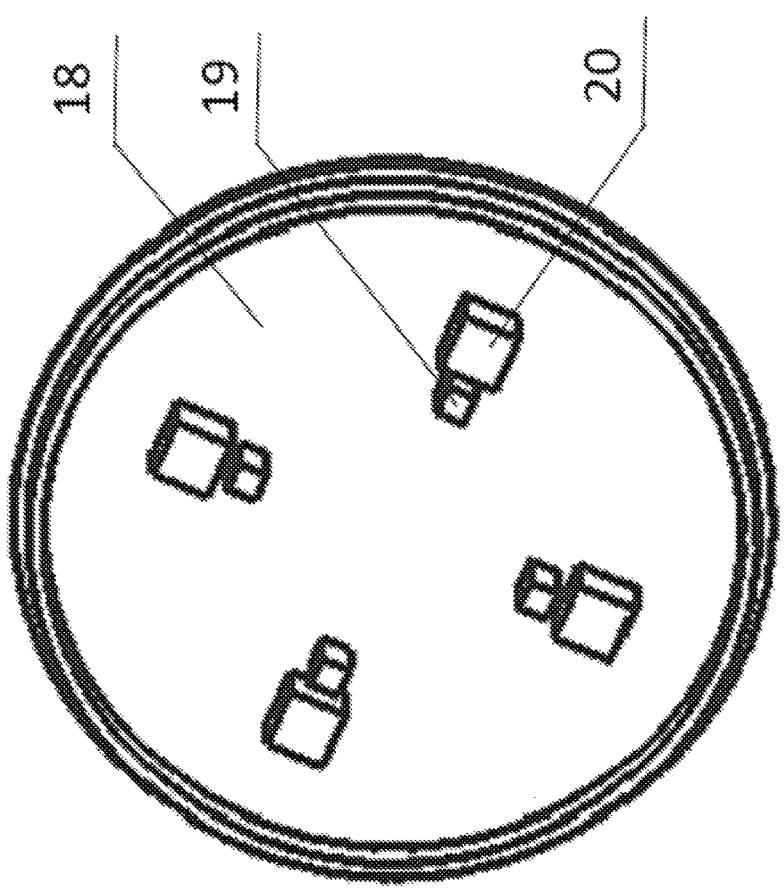
FIG. 7 is a schematic diagram of a structure of end cap "b".
Figure 8:
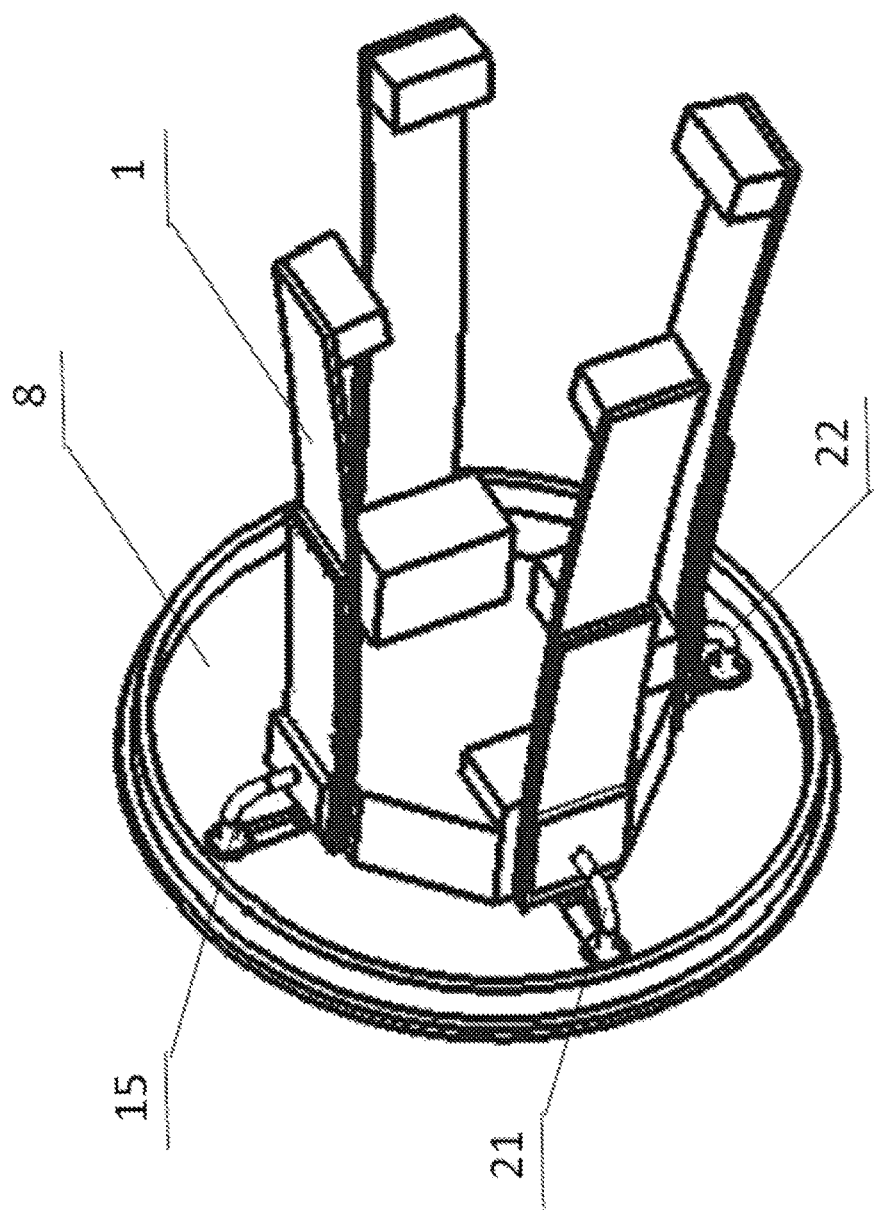
FIG. 8 is a schematic diagram of an overall structure after removing end cap "b" and sleeve.
Figure 9:
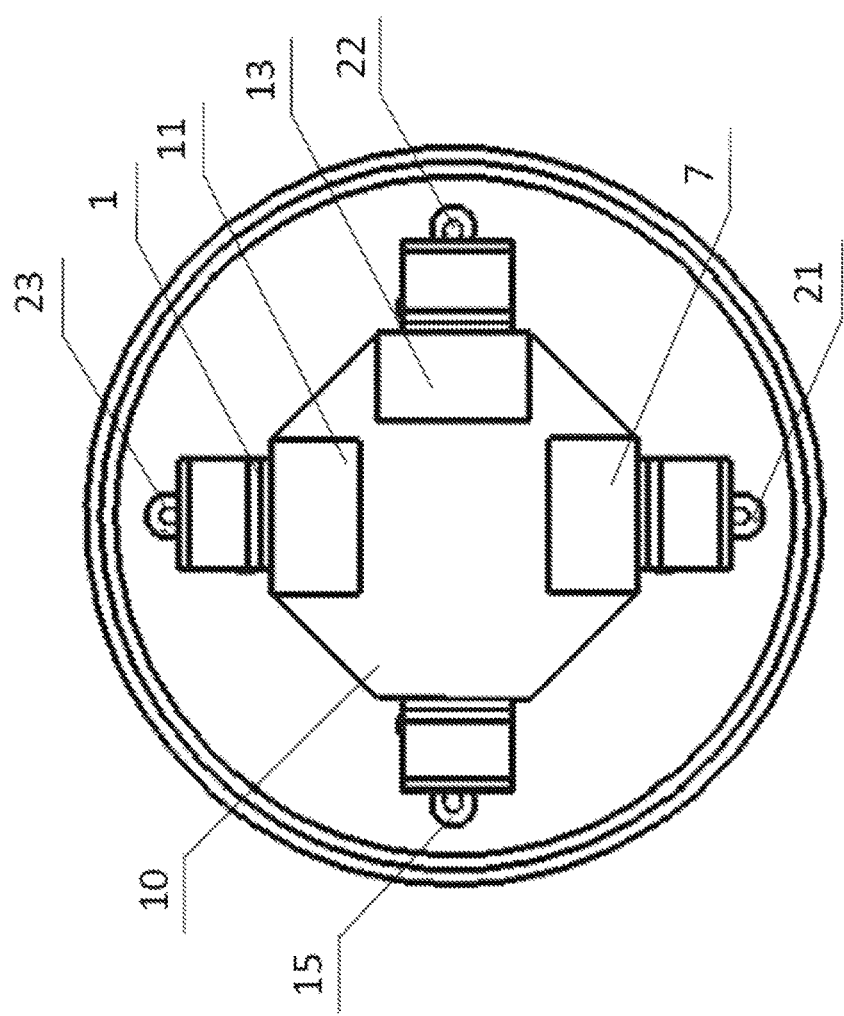
FIG. 9 is a top plane view of an overall structure after removing end cap "b" and sleeve.
Figure 10:
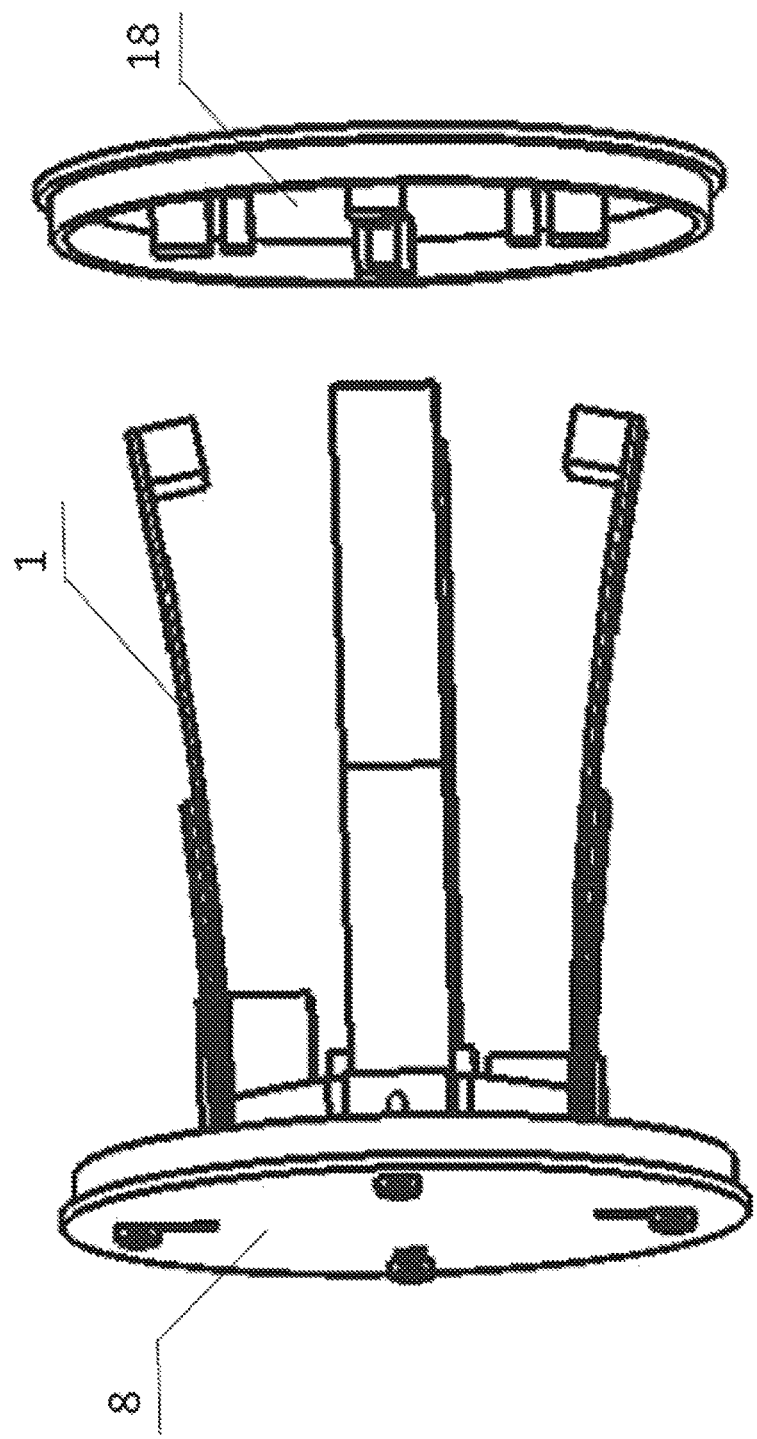
FIG. 10 is a schematic diagram of an overall structure after removing sleeve.
Figure 11:
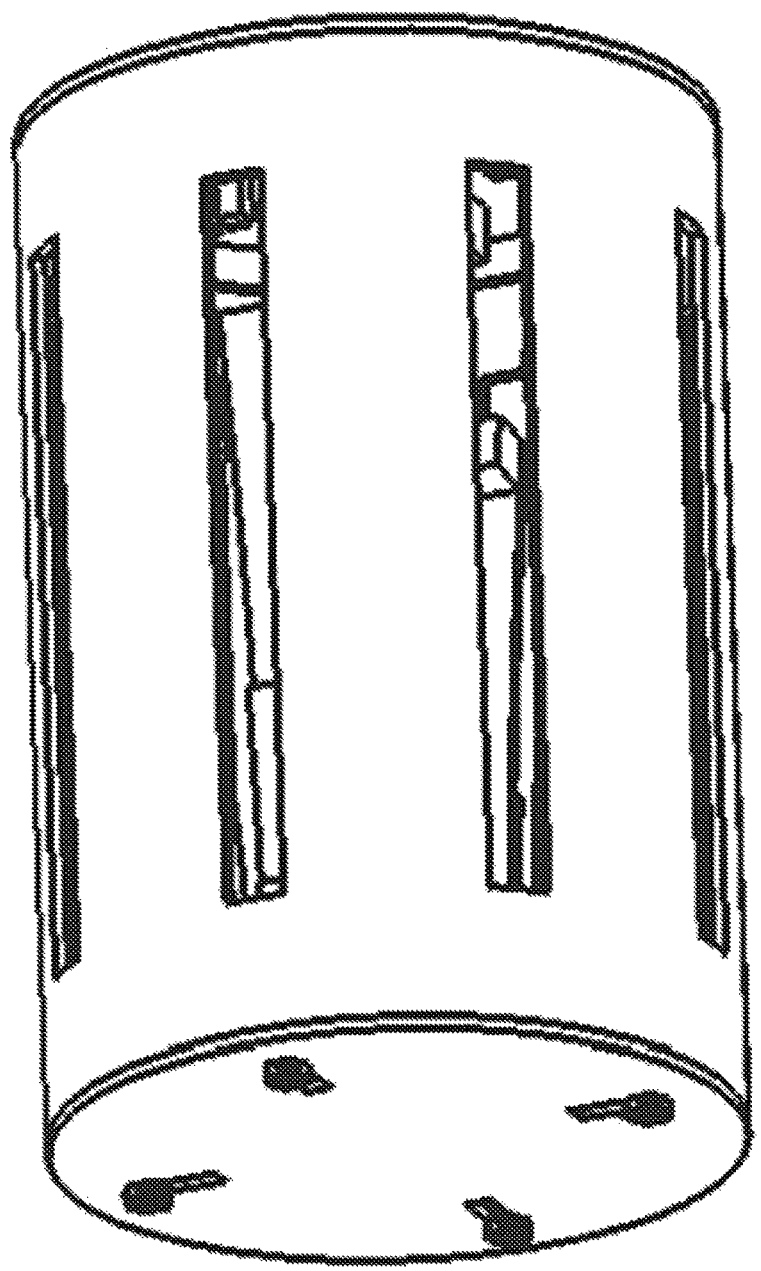
FIG. 11 is a schematic diagram of the overall structure of a drum-type wide-frequency piezoelectric power generation apparatus.

The present disclosure will be described in more detail below accompanying the appended drawings with preferred embodiments. According to FIGS. 1-11.

A drum-type wide-frequency piezoelectric power generation apparatus may include: a piezoelectric vibrator (1), an end cap "a" (8), a clamp "a" (15), a clamp "b" (21), a clamp "c" (22), a clamp "d" (23), a sleeve (17) and end cap "b" (18), piezoelectric vibrator (1) includes a base layer (4), a piezoelectric layer (3), a protective layer (2), and a first permanent magnet (5) in the end, wherein the protective layer (2) is pasted on piezoelectric layer (3) through epoxy resin glue or other conductive adhesives, the piezoelectric layer (3) is pasted on base layer (4) by epoxy resin glue or other conductive adhesives, one end of piezoelectric vibrator (1) far away from the first permanent magnet (5) is fixed on the end cap "a" (8), end cap "a" (10) provided an octagonal boss (10), there are bosses "b" (7), "c"(13), "d" (11) on the surface of boss "a", bosses "a" (10), "b" (7), "c" (13), "d" (11) are integrated structure ; boss "b" (7) is higher than boss "a" (10), boss "c" (13) is higher than boss "b" (7), boss "d" (11) is higher than boss "c" (13), the four piezoelectric vibrators is fixed on four symmetry planes of bosses "a" (10), "b" (7), "c" (13), "d" (11), four planes of end cap "a" (8) fixed on piezoelectric vibrator corresponds to four straight slots respectively, slot "a" (9) corresponds to boss "a" (10), slot "b" (6) corresponds to boss "b" (7), slot "c" (14) corresponds to boss "c" (13), slot "d" (12) corresponds to boss "d" (11), one end of all the clamps with screw thread is extended from one side of straight slots, and it is fixed with a nut, on the other side of the clamps will press piezoelectric vibrator (1) tightly, a compression degree of the piezoelectric vibrator (1) with different thickness can be adjusted by adjusting the position of clamp, clamp "a" (15) corresponds to straight slots "a" (9), clamp "b" (21) corresponds to straight slots "b" (6), clamp "c" (22) corresponds to straight slots "c" (14), clamp "d" (23) corresponds to straight slots "d" (12), the splint(16) length of clamp "b" (21)is longer than clamp "a" (15), the disparity value is about 5%-10% of the length of press piezoelectric vibrator (1), the splint(16) length of clamp "c" (22)is longer than clamp "b" (21), the disparity value is about 7%-15% of the length of press piezoelectric vibrator (1), the splint length of clamp "d" (23)is longer than clamp "c" (22), the disparity value is about 10%-20% of the length of press piezoelectric vibrator (1),sleeve (17) is connected to end cap "a" (8) and they can be tightened, the other end of sleeve (17) is connected with end cap "b" (18), end cap "b" (18) is distributed with four central symmetrical second permanent magnets (20) and four center symmetrical auxiliary magnets (19), the second permanent magnet (20) is placed corresponding to first permanent magnet (5) and they mutually exclusive, the second permanent magnets (20) are located on horizontal motion center line of first permanent magnet (5), auxiliary magnet (19) is closer to the center of end cap "b" (18) than the second permanent magnet (20), and each of second permanent magnets (20) has a corresponding auxiliary magnet (19), and auxiliary magnet (19) is mutually exclusive with first permanent magnet (5).

In some implementations, the four piezoelectric vibrators 1 are connected in parallel with the conductor.

In some implementations, the upper and lower surfaces of piezoelectric layer 3 are laid with electrode, the piezoelectric layer 3 and base layer 4 are respectively connected with a conducting wire.

In some implementations, the protective layer 2 material is polyester.

In some implementations, the piezoelectric layer 3 material is polarization PVDF.

In some implementations, the base layer 4 is a kind of copper, steel, aluminum and aluminum alloy.

In some implementations, the drum-type wide-frequency piezoelectric power generation apparatus may be used in wireless sensor nodes. Wireless sensor nodes may be placed in the natural environment. In these instances, micro battery for the sensors may not be able to provide sufficient power for a long time since power supply of the micro battery is low. Accordingly, there is a need to convert energy of natural to electrical energy. The apparatus of the present disclosure improves conversion efficiency and effectively increase the amount of power supply.

In summary, working frequency, power generation efficiency and the amount of generated power of the apparatus in the present disclosure have been significantly improved as compared with other techniques such as single piezoelectric cantilever beam structures, common bistable pressure piezoelectric cantilever structures and array linear piezoelectric cantilever beam structures.

In addition, the present disclosure is not limited to specific implementation methods. The specific implementation methods above are schematic rather than restrictive. Without departure of the present disclosure, variations of the implementations may be made. All of these belong to the scope of the present disclosure.

What is claimed is:

1. A drum-type wide-frequency piezoelectric power generation apparatus comprising:
   four piezoelectric vibrators;
   an end cap "a";
   a clamp "a";
   a clamp "b";
   a clamp "c";
   a clamp "d";
   a sleeve; and
   an end cap "b", wherein:

the four piezoelectric vibrators includes a base layer, a piezoelectric layer, a protective layer, and a first permanent magnet in the end, the protective layer is pasted on the piezoelectric layer through epoxy resin glue or a conductive adhesive, the piezoelectric layer is pasted on the base layer by epoxy resin glue or a conductive adhesive, an end of four piezoelectric vibrators that is away from the first permanent magnet is fixed on the end cap "a", an end cap "a" is provided an octagonal boss, bosses "b", "c", and "d" are on the surface of boss "a", the bosses "a", "b", "c", "d" are integrated structure, the boss "b" is higher than boss "a", the boss "c" is higher than boss "b", the boss "d" is higher than boss "c", the four piezoelectric vibrators are fixed on four symmetry planes of bosses "a", "b", "c", and "d", the four symmetry planes of the end cap "a" fixed on piezoelectric vibrator correspond to four straight slots respectively, a slot "a" corresponds to the boss "a", a slot "b" corresponds to the boss "b", a slot "c" corresponds to the boss "c", a slot "d" corresponds to the boss "d", an end of clamps with screw thread is extended from one side of straight slots, and is fixed with a nut, another side of the clamps is tightly clamped with at least a part of the four piezoelectric vibrators, a compression degree of the four piezoelectric vibrators with different thickness is adjusted by adjusting a position of clamps, a clamp "a" corresponds to the slot "a", a clamp "b" corresponds to the slot "b", a clamp "c" corresponds to the slot "c", a clamp "d" corresponds to the slot "d", a length of a splint the clamp "b" is a first predetermined value longer than a length of the splint of the clamp "a", the first predetermined value is about 5%-10% of the length of one of the four piezoelectric vibrators, the splint length of the clamp "c" is a second predetermined value longer than the splint of the clamp "b", the second predetermined value is about 7%-15% of the length of one of the four piezoelectric vibrators, the splint length of clamp "d" is a third predetermined value longer than the splint of the clamp "c", the third predetermined value is about 10%-20% of the length of one of the piezoelectric vibrators, a sleeve is connected to the end cap "a" and a connection thereof is tightenable, another end of sleeve is connected with the end cap "b", the end cap "b" is distributed with four central symmetrical second permanent magnets and four center symmetrical auxiliary magnets, the second permanent magnet is placed corresponding to the first permanent magnet, the second permanent magnet and the first permanent magnet are mutually exclusive, the second permanent magnets are located on a horizontal motion center line of the first permanent magnet, an auxiliary magnet is closer to the center of the end cap "b" than to the second permanent magnet, and each of the second permanent magnets has a corresponding auxiliary magnet, and the auxiliary magnet is mutually exclusive with the first permanent magnet.

2. The drum-type wide-frequency piezoelectric power generation apparatus of claim 1, wherein the four piezoelectric vibrators are connected in parallel using a wire.

3. The drum-type wide-frequency piezoelectric power generation apparatus of claim 1, wherein the upper and lower surfaces of piezoelectric layer are laid with electrodes, and piezoelectric layer and base layer are connected with a wire, respectively.

4. The drum-type wide-frequency piezoelectric power generation apparatus of claim 1, wherein a material of the protective layer is polyester.

5. The drum-type wide-frequency piezoelectric power generation apparatus of claim 1, wherein a material of the piezoelectric layer is polarization PVDF.

6. The drum-type wide-frequency piezoelectric power generation apparatus of claim 1, wherein materials of the base layer are at least one of copper, steel, aluminum or aluminum alloy.

* * * * *